United States Patent [19]
Ishihara et al.

[11] Patent Number: 5,476,694
[45] Date of Patent: Dec. 19, 1995

[54] METHOD FOR FORMING DEPOSITED FILM BY SEPARATELY INTRODUCING AN ACTIVE SPECIES AND A SILICON COMPOUND INTO A FILM-FORMING CHAMBER

[75] Inventors: Shunichi Ishihara, Ebina; Masaaki Hirooka, Nabari; Shigeru Ohno, Yokohama, all of Japan

[73] Assignee: Canon Kabushiki Kaisha, Tokyo, Japan

[21] Appl. No.: 371,610

[22] Filed: Jan. 12, 1995

Related U.S. Application Data

[63] Continuation of Ser. No. 203,612, Feb. 28, 1994, abandoned, which is a continuation of Ser. No. 63,066, May 20, 1993, abandoned, which is a continuation of Ser. No. 928,167, Aug. 13, 1992, abandoned, which is a continuation of Ser. No. 668,338, Mar. 14, 1992, abandoned, which is a continuation of Ser. No. 449,451, Dec. 12, 1989, abandoned, which is a continuation of Ser. No. 119,239, Nov. 6, 1987, abandoned, which is a continuation of Ser. No. 790,303, Oct. 22, 1985, abandoned.

[30] Foreign Application Priority Data

Oct. 24, 1984 [JP] Japan ................... 59-222211
Oct. 25, 1984 [JP] Japan ................... 59-223081
Oct. 26, 1984 [JP] Japan ................... 59-223853

[51] Int. Cl.$^6$ .................................................. B05D 3/08
[52] U.S. Cl. ......................... 427/585; 427/586; 427/595; 427/255.2
[58] Field of Search ........................... 427/585, 586, 427/595, 225.2

[56] References Cited

U.S. PATENT DOCUMENTS

| | | | |
|---|---|---|---|
| 4,051,382 | 9/1977 | Ogawa et al. | 250/531 |
| 4,217,374 | 5/1978 | Ovshinsky et al. | 427/86 |
| 4,282,267 | 8/1981 | Küyel | 427/38 |
| 4,471,042 | 9/1984 | Komatsu | 430/64 |
| 4,517,223 | 5/1985 | Ovshinsky et al. | 427/39 |
| 4,526,805 | 7/1985 | Yoshizawa | 427/39 |

OTHER PUBLICATIONS

Janai et al "Chemical Vapor Deposition of Amorphous Silicon Prepared from SiF$_2$ Gas", J. Appl. Phys. 52 (5), May 1981 pp. 3622–3624.

*Primary Examiner*—Benjamin Utech
*Attorney, Agent, or Firm*—Fitzpatrick, Cella, Harper & Scinto

[57] ABSTRACT

A method for forming a deposition film, comprising decomposing a first compound containing germanium and halogen in an activation chamber by applying an energy to form an active species; separately introducing, into a film-forming chamber for forming a deposition film on a substrate, a second compound containing silicon and hydrogen and the active species, which is capable of chemical interaction with the second compound containing silicon and hydrogen; and applying to a mixture of the second compound and the active species at least one excitation energy selected from optical, thermal and discharge energies to excite the second compound in the mixture, thereby facilitating the formation of a deposition film on the substrate.

16 Claims, 7 Drawing Sheets

METHOD FOR FORMING DEPOSITED FILM BY SEPARATELY INTRODUCING AN ACTIVE SPECIES AND A SILICON COMPOUND INTO A FILM-FORMING CHAMBER

This application is a continuation of application Ser. No. 08/203,612 filed Feb. 28, 1994, now abandoned, which is a continuation of application Ser. No. 08/063,066 filed May 20, 1993, now abandoned, which is a continuation of application Ser. No. 07/928,167 filed Aug. 13, 1992, now abandoned, which in turn is a continuation of application Ser. No. 07/668,338 filed Mar. 14, 1991, now abandoned, which in turn is a continuation of application Ser. No. 07/449,451 filed Dec. 12, 1989, now abandoned, which in turn is a continuation of application Ser. No. 07/119,239 filed on Nov. 6, 1987, now abandoned, which in turn is a continuation of application Ser. No. 06/790,303 filed Oct. 22, 1985, now abandoned.

BACKGROUND OF THE INVENTION

1. Field of the Invention

The present invention relates to a method suitable for forming a silicon-containing deposition film, principally a functional film, and more particularly a non-single crystalline deposition film such as amorphous silicon or polycrystalline silicon adapted for use in semiconductor devices, electrophotographic photosensitive devices, linear image sensors, image pickup devices, photovoltaic devices or the like.

2. Description of the Prior Art

As an example, formation of an amorphous silicon film (hereinafter abbreviated "a—Si") has been tried with various methods such as vacuum evaporation, plasma CVD, CVD, reactive sputtering, ion plating and light CVD. The plasma CVD method is generally employed in industrial application.

However a deposition film composed of amorphous silicon still has many points to be improved, in terms of electrical and optical properties, fatigue characteristic in repeated use, behavior in the atmospheric conditions at use, and productivity or mass-productivity including uniformity and reproducibility.

The reaction involved in the formation of an amorphous silicon deposition film through the conventionally popular plasma CVD method is considerably more complicated than that in the coventional CVD method, and the mechanism thereof has not been fully clarified. Also such deposition film method has many parameters such as temperature of substrate, flow rate and ratio of introduced gasses, pressure at film formation, high-frequency-electric power, structure of electrode, structure of reactor, rate of gas discharge, plasma generating method etc., which in combination often result in unstable plasma generation, eventually giving rise to a significant undesirable effect to the deposited film. Also the manufacturing parameters have to be determined for each apparatus, so that it has been difficult to generalize such manufacturing conditions. However the use of the plasma CVD method is presently accepted as the best for obtaining an amorphous silicon film with satisfactory electrical, optical, photoconductive or mechanical properties required in various applications.

In certain applications requiring high-speed reproducible mass production while sufficiently achieving a larger film with uniform thickness and quality, there is required a significant capital investment in the mass production equipment for the formation of amorphous silicon deposition film through the plasma CVD method, with complex control parameters of narrow control tolerances, and the equipment itself requires delicate control. On the other hand, the conventional technology with the ordinary CVD method requires a high temperature and is unable to provide a practically acceptable deposition film.

As explained in the foregoing, there has been long desired a method capable of mass producing the amorphous silicon film with inexpensive equipment, while maintaining the uniformity and other properties required in the application. The same requirements exist also for other functional films, such as films of silicon nitride, silicon carbide, or silicon oxide.

The present invention, therefore, is to provide a novel method of film deposition, which is free from the above-mentioned drawbacks of the plasma CVD method and is not dependent on the conventional technologies.

SUMMARY OF THE INVENTION

An object of the present invention is to provide a method for forming a deposition film adapted for producing a larger film, thus easily achieving higher productivity and mass production, while improving the characteristic, film forming speed and reproducibility and maintaining the uniformity in the produced film.

According to the present invention, there is provided a method for forming a deposition film, by introducing a silicon compound constituting a material for film formation and an active species formed from a compound containing germanium and halogen atoms and capable of chemical interaction with said silicon compound into a film forming chamber for forming a deposition film on a substrate, and applying at least one energy selected from Optical, thermal and electrical discharge energies thereto, thereby exciting said silicon compound and causing a reaction thereof, thus forming a deposition film on said substrate.

DETAILED DESCRIPTION OF THE PREFERRED EMBODIMENTS

Figure 1:
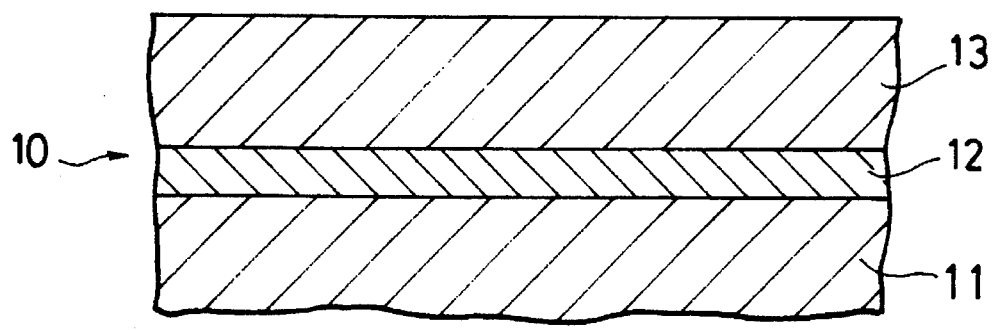
FIG. 1 is a schematic view showing an example of an electrophotographic imaging member produced with the method of the present invention.

In the method of the present invention, a previously activated species is introduced into the film forming chamber as one of the materials for film formation, so that film formation is rendered possible with an optical, thermal or discharge energy applied in said chamber. Consequently the deposition film thus formed is substantially free from etching or other undesirable effects caused by for example abnormal discharge.

Also the method of the present invention allows operation of the CVD process in a more stable manner by arbitrarily controlling the temperatures of the substrate and atmosphere in said chamber.

In the method of the present invention, the exciting energy may be applied either uniformly or selectively to the materials reaching the vicinity of the substrate. In the case of using optical energy, it may either be directed to the entire surface of the substrate through an appropriate optical system to form a deposition film on said surface, or directed only to a desired part to form the deposition film in a partial area. It is also possible to form a deposition film by irradiation of a determined pattern, defined for example with a photoresist.

In the case of using thermal energy, it is applied at least to the vicinity of the substrate in the film forming chamber, or to the entire chamber. Any known heating method, for example heating with a heat generating element such as an electrical resistor or high-frequency heating, may be employed for this purpose. It is also possible to utilize thermal energy converted from optical enerzy, or, if desired, to utilize optical energy in combination with thermal energy.

Furthermore, in the method of the present invention, energy of electrical discharge may also be employed as the exciting energy, optionally in combination with optical and/or thermal energy.

One of the differences between the method of the present invention and the conventional CVD process lies in a fact that the use of an active species which is activated in advance in an activating space or chamber separate from the film forming chamber, and this fact enables drastic improvement in the film forming speed in comparison with the conventional CVD process and to use a lower substrate temperature at the film formation, thus realizing large-scale low-cost production of a deposition film of stable quality.

The aforementioned active species employed in the present invention are a substance capable of a chemical interaction with the aforementioned compound for film formation or an excited deposition compound thereof, thus providing an energy thereto or causing a chemical reaction therewith to accelerate the formation of the deposition film. Consequently the active species may or may not contain a component which will become a constituent of the layer to be formed.

According to the present invention, in consideration of the productivity and ease of handling, the active species to be introduced from the activating chamber to the film forming chamber has a lifetime preferably of 0.1 second or longer, more preferably of 5 seconds or longer, and most preferably of 15 seconds or longer.

The silicon compound employed in the present invention as a material for forming the deposition film is preferably in the gaseous state prior to the introduction into the film forming chamber, or is gasified at the introduction. For example a liquidous compound may be introduced into the film forming chamber after gasification with a suitable gasifier connected to the source of the compound. Examples of the silicon compounds employable in the present invention are silanes and siloxanes in which hydrogen, oxygen, halogens and/or hydrocarbon groups are combined to silicon, and particularly preferred are linear and cyclic silanes, and substituted silanes in which all or a part of the hydrogen atoms in such a linear or cyclic silane are substituted by halogen atoms.

Specific examples of such compounds are linear silanes represented by a general formula $Si_pH_{2p+2}$ wherein p is an integer at least equal to 1, preferably in a range from 1 to 15, more preferably in a range from 1 to 10, such as $SiH_4$, $Si_2H_6$, $Si_3H_8$, $Si_4H_{10}$, $Si_5H_{12}$ or $Si_6H_{14}$; branched linear silanes represented by a general formula $Si_pH_{2p+2}$ wherein p has the same meaning as above such as $SiH_3SiH(SiH_3)SiH_3$, $SiH_3SiH(SiH_3)Si_3H_7$ or $Si_2H_5 SiH(SiH_3)Si_2H_5$); substituted compounds obtained by substituting all or a part of the hydrogen atoms of said linear or branched linear silanes with halogen atoms; cyclic silanes represented by a general formula $Si_qH_{2q}$ wherein q is an integer at least equal to 3, preferably in a range from 3 to 6, such as $Si_3H_6$, $Si_4H_8$, $Si_5H_{10}$ or $Si_6H_{12}$; substituted compounds obtained by substituting all or a part of the hydrogen atoms of the cyclic silanes with other cyclic silanyl groups and/or linear silanyl groups; and halogen-substituted linear or cyclic silanes represented by a general formula $Si_rH_sX_t$ wherein X stands for a halogen atom, r is an integer at least equal to 1, preferably in a range from 1 to 10, more preferably in a range from 3 to 7, and s+t is equal to 2r+2 or 2r, obtained by substituting all or a part of the hydrogen atoms of the above-mentioned silanes with halogen atoms, such as $SiH_3F$, $SiH_3Cl$, $SiH_3Br$ or $SiH_3I$. These compounds may be employed singularly or as a mixture thereof.

In the present invention, the germanium and halogen containing compound to be introduced into the activating chamber is a compound obtained for example by substituting all or a part of hydrogen atoms of a linear or cyclic germanium hydride with halogen atoms, and specific examples of such compounds are linear germanium halides represented by a general formula $Ge_uY_{2u+2}$ wherein u is an integer at least equal to 1 and Y is F, Cl, Br or I; cyclic germanium halides. represented by a general formula $Ge_vY_{2v}$ wherein v is an integer at least equal to 3 and Y has the same meaning as above; and linear or cyclic compounds represented by a general formula $Ge_uH_xY_y$ wherein u and y have the same meaning as above, and x+y is equal to 2u or 2u+2.

Specific examples of the above-mentioned compounds are gaseous or easily gasifiable ones such as $GeF_4$, $(GeF_2)_5$, $(GeF_2)_6$, $(GeF_2)_4$, $Ge_2F_6$, $Ge_3F_8$, $GeHF_3$, $GeH_2F_2$, $GeCl_4$, $(GeCl_2)_5$, $GeBr_4$, $(GeBr_2)_5$, $Ge_2Cl_6$ and $Ge_2Cl_3F_3$.

In the present invention, in addition to the active species obtained by activating the aforementioned compound containing germanium and halogen, it is possible to use, in combination, an active species generated by activating a compound containing silicon and halogen and/or an active species generated by activating a compound containing. carbon and halogen.

Examples of such compounds containing silicon and halogen are those obtained by substituting all or a part of the hydrogen atoms of linear or cyclic silanes with halogen atoms, and more specifically are linear silicon halides represented by a general formula $Si_uY_{2u+2}$ wherein u is an integer at least equal to 1 and Y is F, Cl, Br or I; cyclic silicon halides represented by a general formula $Si_vY_{2v}$ wherein v is an integer at least equal to 3 and Y has the same meaning as above; and linear or cyclic compounds represented by a general formula $Si_uH_xY_y$ wherein u and Y have the same meaning as above, and x+y is equal to 2u or 2u+2.

Specific examples of the above-mentioned compounds are gaseous or easily gasifiable ones such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SICl_2)_5$, $SiBr_4$, $(SiBr_2)_5$, $Si_2Cl_6$ and $Si_2Cl_3F_3$. These silicon compounds may be employed singularly or as a mixture thereof.

The carbon and halogen containing compound is a compound obtained for example by substituting all or part of the hydrogen atoms of a linear or cyclic hydrocarbon with halogen atoms, and specific examples of such compounds are linear carbon halides represented by a general formula $C_uY_{2u+2}$ wherein u is an integer at least equal to 1 and Y is F, Cl, Br or I; cyclic silicon halides represented by a general formula $C_vY_{2v}$ wherein v is an integer at least equal to 3 and Y has the same meaning as above; and linear or cyclic compounds represented by a general formula $C_uH_xY_y$ wherein u and y have the same meaning as above, and x+y is equal to 2u or 2u+2.

Specific examples of the above-mentioned compounds are gaseous or easily gasifiable ones such as $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$ and $C_2Cl_3F_3$. These carbon compounds may be employed singularly or be a mixture thereof.

For generating the active species such as one of the aforementioned compounds containing germanium and halogen, there may be employed germanium, other germanium compounds, hydrogen and halogen compounds such as $F_2$ gas, $Cl_2$ gas, gasified $Br_2$, $I_2$ etc., in addition to such compound.

In the present invention, the formation of active species in the activating chamber is achieved by an exciting energy such as discharge, thermal or optical energy in consideration of the apparatus and equipment in the respective case.

The active species are generated by applying an exciting energy such as heat, light or electrical discharge to the above-mentioned substance in the activating chamber.

In the present invention, the ratio, in the film forming chamber, of the silicon compound employed as the film forming material and the active species from the activating chamber is suitably determined in consideration of the film forming conditions and of the active species employed, but is preferably in a range from 10:1 to 1:10 in the ratio of introduced flow rates, and more preferably in a range from 8:2 to 4:6.

In the present invention, in addition to the above-mentioned silicon compound, there may be introduced, into the film forming chamber, other layer forming materials such as hydrogen gas, halogen compound such as $F_2$ gas, $Cl_2$ gas, gasified $Br_2$ or $I_2$, and inert gas such as argon or neon. In case of using a plurality of such gases, they may either be mixed prior to the introduction to the film forming chamber or be supplied separate to the film forming chamber from respective sources.

It is also possible to dope the deposition film, prepared according to the method of the present invention, with an impurity element. Preferred examples of p-type impurity are the elements of group IIIA of the periodic table, such as B, Al, Ga, In and Tl, and those of n-type impurity are the elements of group VA of the periodic table, such as N, P, As, Sb and Bi, in which particularly preferred ones are B, Ga, P and Sb. The amount of doping is suitably determined in consideration of the electrical and optical characteristics required.

Preferably there is to be employed a compound containing such impurity element as a component thereof, which is gaseous under normal temperature and pressure, or is gaseous at least under the film depositing conditions and easily gasifiable with a suitable gasifier. Examples of such compounds are $PH_3$, $P_2H_4$, $PF_3$, $PF_5$, $PCl_3$, $AsH_3$, $AsF_3$, $AsF_5$, $AsCl_3$, $SbH_3$, $SbF_5$, $BH_3$, $BF_3$, $BCl_3$, $BBr_3$, $B_2H_6$, $B_4H_{10}$, $B_5H_9$, $B_5H_{11}$, $B_6H_{10}$, $B_6H_{12}$ and $AlCl_3$. Such impurity containing compounds may be employed singularly or as a mixture of two or more.

Such impurity containing compounds may be introduced into the film forming chamber, either in a mixed state with the aforementioned silicon compound etc. prior to the introduction, or separately from respective gas sources.

In the following the present invention will be further described with reference to examples of an electrophotographic imaging member prepared by the method of the present invention.

FIG. 1 schematically shows the structure of a typical photoconductive member obtained by the method of the present invention.

A photoconductive member 10, shown in FIG. 1, can be employed as an electrophotographic imaging member, and comprises a substrate 11, an intermediate layer 12 as optionally formed, and a photosensitive layer 13.

The substrate 11 can be either electrically conductive or insulating. A conductive substrate can be composed, for example, of a metal such as NiCr, stainless steel, Al, Cr, Mo, Au, Ir, Nb, Ta, V, Ti, Pt, Pd or an alloy thereof.

An insulating substrate can be composed of a film or a sheet of a synthetic resin such as polyester, polyethylene, polycarbonate, cellulose acetate, polypropylene, polyvinyl chloride, polyvinylidene chloride, polystyrene or polyamide, glass, ceramic material or paper. Such insulating substrate is preferably subjected, at least on a surface thereof, to a treatment for obtaining conductivity, and other layers are preferably provided on the surface which is thus rendered conductive.

As an example, in the case of a glass substrate, electrical conductivity is realized by forming a thin layer of NiCr, Al, Cr, Mo, Au, Ir, Nb, Ta, V, Ti, Pt, Pd, $In_2O_3$, $SnO_2$, or ITO ($In_2O_3+SnO_2$) on a surface of the substrate. On the other hand, in the case of a plastic film such as polyester film, the conductive treatment is effected by depositing a metal such as NiCr, Al, Ag, Pb, Zn, Ni, Au, Cr, Mo, Ir, Nb, Ta, V, Ti or Pt by vacuum evaporation, electron beam evaporation or sputtering, or laminating the abovementioned metal. The substrate may be arbitrarily shaped, for example a cylinder, a belt or a plate according to the intended use. For example, the photoconductive member 10 shown in FIG. 1 is desirably formed as an endless belt or a cylinder in case of use as an electrophotographic imaging member for high-speed continuous copying.

The intermediate ! layer 12 is for example provided with a function of effectively blocking the flow of carriers from the substrate 11 to the photosensitive layer 13 and allowing the movement of photocarriers, generated in the photosensitive layer 13 by irradiation of an electromagnetic wave, from the photosensitive layer 13 toward the substrate 11.

The intermediate layer 12 is composed of amorphous silicon containing hydrogen atoms (H) and/or halogen atoms (X) (hereinafter expressed a-Si(H, X)) and contains a p-type impurity such as B or an n-type impurity such as P for controlling the electrical conductivity.

In the present invention, the amount of such conductivity-controlling material such as B or P present in the intermediate layer 12 is preferably in a range of $0.001–5\times 10^4$ atomic ppm, more preferably in a range of $0.5–1\times 10^4$ atomic ppm, and most preferably in a range of $1–5\times 10^3$ atomic ppm.

In the case the intermediate layer 12 is formed, the formation of the photosensitive layer 13 can be effected in a continuous manner. In such case the active species generated in the activating chamber and silicon compound in gaseous state, optionally together with hydrogen, halogen compound, inert gas, impurity-containing gaseous compound etc. are introduced into the film forming chamber containing the substrate 11, and at least one exciting energy selected from optical, thermal and discharge energies is applied to form the intermediate layer 12 on the substrate 11.

The compound containing germanium and halogen, introduced into the activating chamber at the formation of the intermediate layer 12, easily generate an active species such as $GeF_2*$ at a high temperature.

The thickness of the intermediate layer 12 is preferably in a range from 30 Å to 10μ, more preferably from 40 Å to 8μ, and most preferably from 50 Å to 5μ.

The photosensitive layer 13 is composed for example of a—Si(H, X), and has functions of generating photocarriers in response to the irradiation of a laser beam and of transporting said photocarriers.

The thickness of the photosensitive layer 13 is preferably in a range from 1 to 100μ, more preferably from 1 to 80μ, and most preferably from 2 to 50μ.

The photosensitive layer 13 is composed of undoped a—Si(H, X), but, if desirable, it may contain a material for achieving a conductive polarity opposite to that of the polarity-determining material in the intermediate layer 12, or a material for achieving a conductive polarity the same as that of but in a smaller amount than the polarity-determining material in the intermediate layer 12.

The formation of the photosensitive layer 13 is achieved, as in the case of the intermediate layer 12, by introducing the compound containing germanium and halogen into the activating chamber, and introducing the active species, generated by decomposition of the compound at a high temperature, into the film forming chamber. Separately the silicon compound in gaseous state, optionally together with hydrogen, halogen compound, inert gas, impurity-containing gaseous compound etc. is introduced into the film forming chamber containing the substrate 11, and at least one exciting energy, selected from optical, thermal and discharge energies, is applied to form the intermediate layer 12 on the substrate 11.

Figure 2:
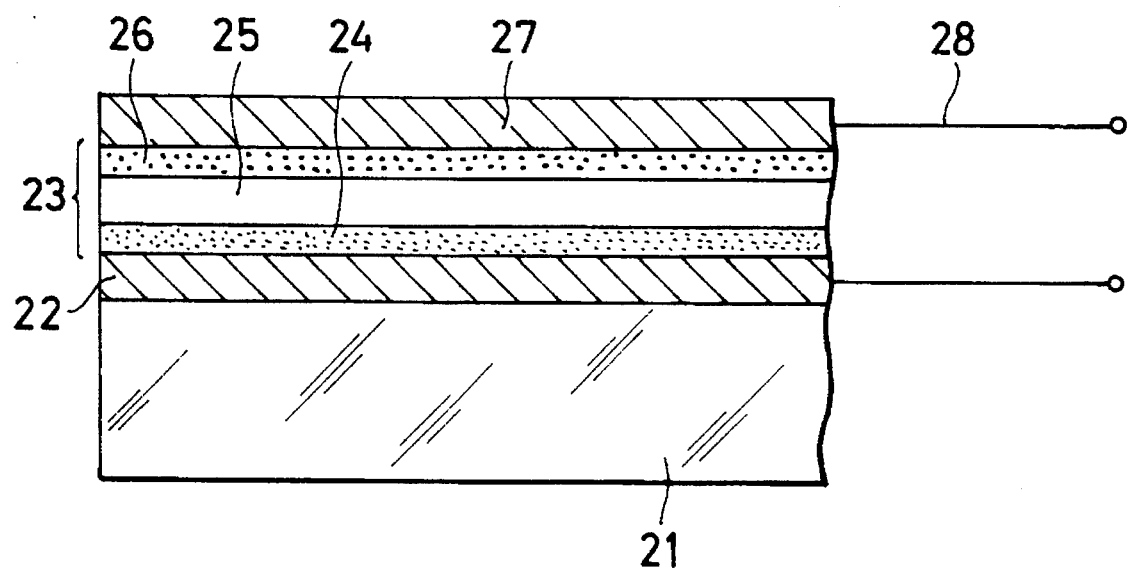
FIG. 2 is a schematic view showing an example of a PIN diode produced by the method of the present invent ion.

FIG. 2 schematically shows a PIN diode device utilizing an impurity-doped a—Si deposition film obtained by the method of the present invention.

In FIG. 2, there are shown a substrate 21, thin film electrodes 22, 27, a semiconductor layer 23 consisting of an n-type a—Si layer 24, an i-type a—Si layer 25 and a p-type a—Si layer 26, and conductors 28.

The substrate 21 is semiconductive or, preferably, insulating. Examples of semiconductive substrate are Si and Ge. The thin film electrodes 22, 27 are obtained by depositing thin films for example of NiCr, Al, Cr, Mo, Au, Ir, Nb, Ta, V, Ti, Pt, Pd In$_2$O$_3$, SnO$_2$, ITO (In$_2$O$_3$+SnO$_2$) etc. by vacuum evaporation, electron beam evaporation or sputtering onto the substrate. The thickness of the electrodes 22, 27 is preferably in a range of 30–5×10$^4$ Å, more preferably in a range of 100–5×10$^3$ Å.

The layer constituting the a—Si semiconductor layer 23 can be rendered n-type layer 24 or p-type layer 26 by controlled doping with an n-type impurity and/or a p-type impurity.

In the present invention, the formation of an a—Si layer of n-, i- or p-type is achieved by introducing the compound containing germanium and halogen into the activating chamber, and introducing an active species such as GeF$_2$*, generated by decomposition of the compound at a high temperature, into the film forming chamber. Separately the silicon containing compound in gaseous state, optionally together with an inert gas, an impurity-containing gaseous compound etc., is introduced into the film forming chamber containing the substrate 11, and at least one exciting energy selected from optical, thermal and discharge energies is applied. The thickness of n- or p-type a—Si layer is preferably in a range from 100 to 10$^4$ Å, more preferably from 300 to 2000 Å. The thickness of i-type a—Si layer is preferably in a range from 500 to 104 Å, more preferably from 1000 to 10000 Å.

In the following the present invention will be further described by specific examples thereof.

EXAMPLE 1

Figure 3:
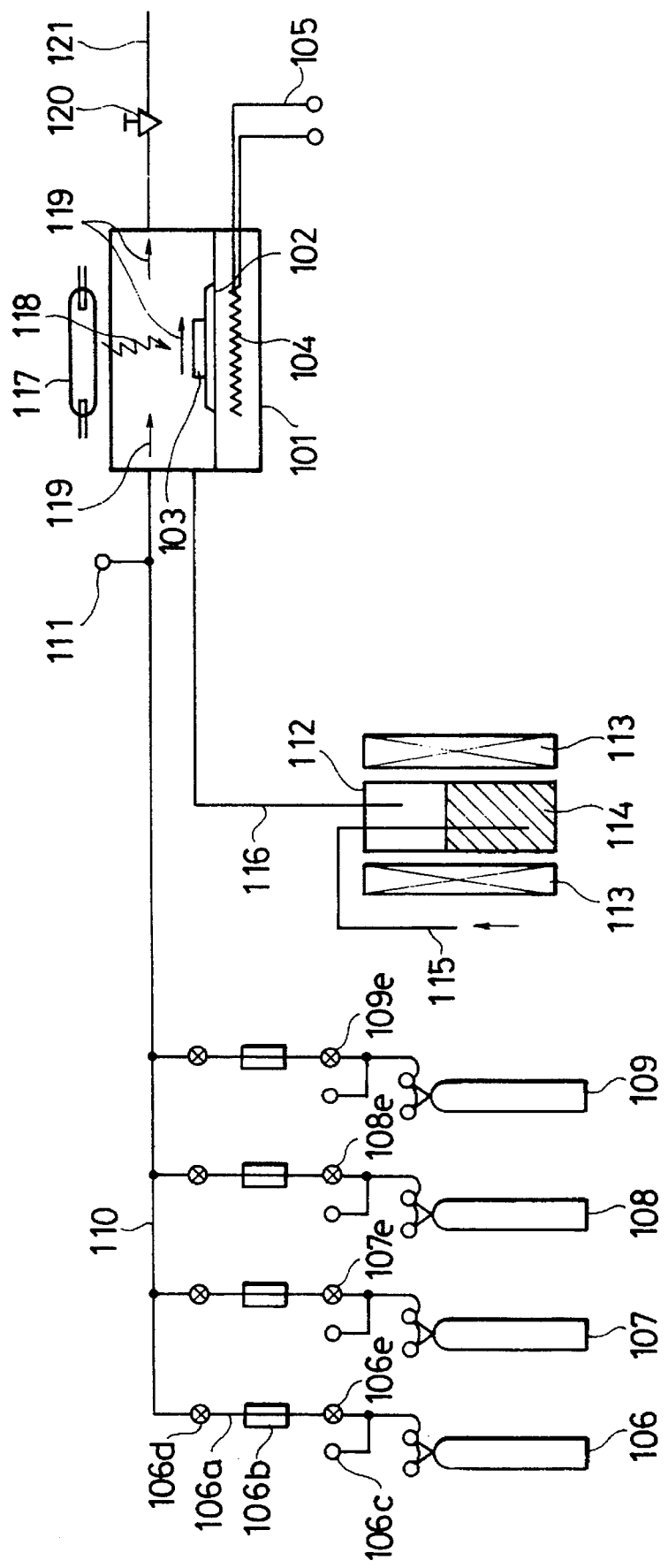
FIGS. 3, 4, 5, 6, 7 and 8 are schematic views showing the structure of apparatus for executing the methods of the present invention employed in the embodiments thereof.

An apparatus shown in FIG. 3 was employed in the preparation of a—Side position films of i-, p- and n-type through the following operations.

Referring to FIG. 3, a film forming chamber 101 is provided therein with a substrate support 102 on which a desired substrate 103 is placed.

A heater 104 for heating the substrate 103 is powered through lead wires 105 but is not activated during the film formation. The temperature of the substrate is not critical, but, in the case where the substrate is to be heated prior to the film formation in the execution of the method of the present invention, the substrate is preferably heated to a temperature in a range of 50°–150° C., more preferably 100°–150° C.

Gas sources 106–109 are provided for the silicon compound, and for other gases optionally employed such as hydrogen, halogen compound, inert gas, impurity-containing compound etc. A suitable gasifier is provided for any liquidous material to be employed. In the gas sources 106–109, suffices a indicate branch tubes, b flow meters, c pressure gauges for measuring the pressure at the high-pressure side of the flow meters, d and e valves for adjusting flow rates. There are further provided a gas introducing pipe 110 into the film forming chamber; a gas pressure gauge 111; an activating chamber 112; an electric furnace 113; solid germanium particles 114; an introducing tube 115 for the gaseous compound containing germanium and halogen for generating the active species; and an introducing tube 116 for the active species, generated in the activating chamber 112, into the film forming chamber 101.

An optical energy generator 117 is composed for example of a mercury lamp, a xenon lamp, a carbon dioxide laser, an argon ion laser or an excimer laser.

Light 118 emitted from the optical energy generator 117 and directed to the entire substrate or a desired part thereof through a suitable optical system (not shown) irradiates the raw material gas flowing in a direction 119, thus exciting the gas and causing reaction therein to form an a—Si deposition film on the substrate 103 or a part thereof. In FIG. 3 there are also shown an exhaust valve 120 and an exhaust tube 121.

At first a substrate 103 composed of a polyethylene terephthalate was placed on the support 102, and the film forming chamber 101 was evacuated to 10$^{-6}$ Torr with a vacuum system. The substrate was maintained at a temperature shown in Table 1, and 150 sccm of Si$_5$H$_{10}$ from the gas source 106, optionally mixed with 40 sccm of PH$_3$ or B$_2$H$_6$, diluted to 1000 ppm with hydrogen gas, was introduced into the chamber.

The activating chamber 102 was filled with solid germanium particles 114, which were melted by heating with the electric furnace 113, and Ge$_4$ was blown therein from a bomb container through the tube 115 thus generating an active species GeF$_2$*. It was then introduced through the tube 116 into the film forming chamber 101.

The pressure in the chamber 101 was maintained at j0.1 Torr, and the substrate was vertically irradiated with a xenon lamp of 1 kw to form an undoped or doped a—Si film of a thickness of 700 Å, with a film forming speed of 21 Å/sec.

The undoped or p-type a—Si film thus formed was then placed in an evaporation tank for forming comb-shaped aluminum electrodes (length 250μ, width 5 mm) at a pressure of 10$^{-5}$ Torr. The obtained sample of a—Si film was evaluated by the dark conductivity σ$_d$ calculated from the dark current at an applied voltage of 10 V. The results are shown in Table 1.

EXAMPLES 2–4

The process of Example 1 was repeated except that $Si_5H_{10}$ was replaced by linear $Si_4H_{10}$, branched $Si_4H_{10}$ or $H_6Si_6F_6$. The obtained values of dark conductivity are summarized in Table 1.

The results in Table 1 indicate that the method of the present invention allows the obtainment of an a—Si film having excellent electrical properties, that is, a satisfactorily high value of σ even at a low substrate temperature, and to achieve a sufficient doping therein.

EXAMPLE 5

Figure 4:
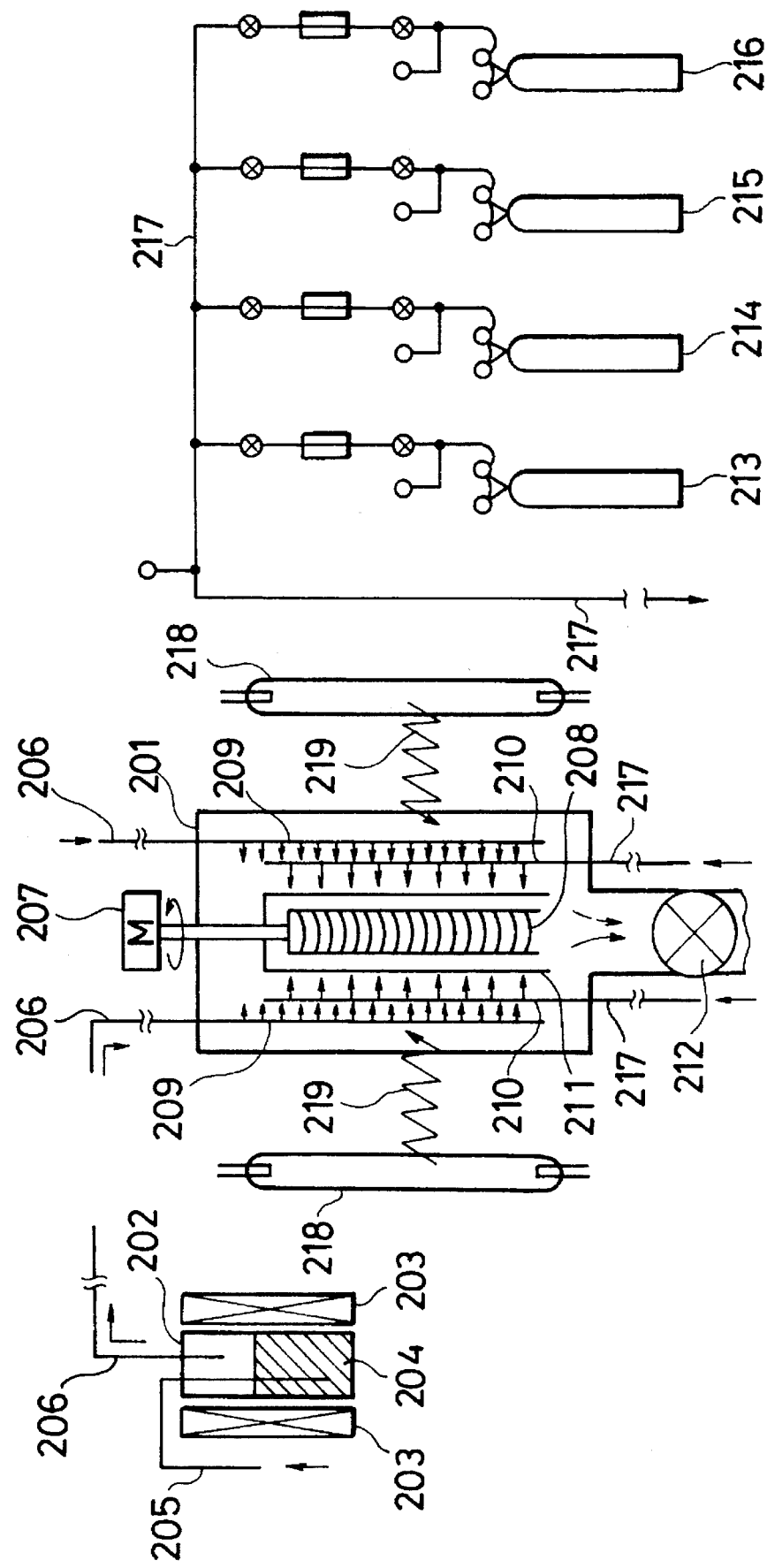

An apparatus shown in FIG. 4 was employed for preparing a drum-shaped electrophotographic imaging member of a structure as shown in FIG. 1, through the following operations.

Referring to FIG. 4, there are provided a film forming chamber 201, an activating chamber 202, an electric furnace 203, solid germanium particles 204, a tube for introducing active species forming substance 205, an active species introducing tube 206, a motor 207, a heater 208, blowing tubes 209 and 210, an aluminum cylinder 211, an exhaust valve 212, gas sources 213–216 similar to those 106–109 shown in FIG. 1, and a gas introducing tube 217.

The aluminum cylinder 211 suspended in the film forming chamber 201 was rendered rotatable by the motor 207 and was internally heated by the heater 208. Optical energy generators 218 illuminated a desired part of the cylinder 211 with light 219.

The activating chamber 202 was charged with solid germanium particles 204, which were melted by heating with the electric furnace 203, and $GeF_4$ gas was blown therein from a bomb container to generate an active species $GeF_2^*$ for supply into the film forming chamber 201 through the tube 206.

Separately $Si_2H_6$ and $H_2$ were introduced through the tube 217 into the chamber 201, maintained at a pressure of 1.0 Torr, and the periphery of the cylinder 211 was vertically illuminated by xenon lamps of 1 kw.

During the process, the cylinder 211 was rotated, and the used gas was discharged through the exhaust valve 212. A photosensitive layer 13 was formed in this manner.

An intermediate layer of a thickness of 2000 Å was also formed by introducing a gaseous mixture of $H_2$ and $B_2H_6$, containing $B_2H_6$ in 0.2 vol. %, through the tube 217.

Reference Example 1

An amorphous silicon deposition film was formed in an ordinary plasma CVD process, utilizing $SiF_4$, $Si_2H_6$, $H_2$ and $B_2H_6$ in the film forming chamber shown in FIG. 4 equipped with a high frequency generator of 13.56 MHz.

Table 2 summarizes the manufacturing conditions and performances of the drum-shaped electrophotographic imaging members obtained in Example 5 and Reference Example 1.

EXAMPLE 6

A PIN diode as shown in FIG. 2 was prepared in the apparatus shown in FIG. 3, utilizing $Si_3H_6$ as the silicon compound.

A polyethylene naphthalate substrate 21 having an evaporated ITO film 22 of a thickness of 1000 Å was placed on the support, and the chamber was evacuated to $10^{-6}$ Torr. Then an active species $GeF_2^*$ was introduced from the tube 116 as in Example 1, 150 sccm of $Si_3H_6$ and $PH_3$ diluted to 1000 ppm with hydrogen gas from the tube 110, and 20 sccm of a halogen gas from another tube, and light irradiation with a xenon lamp of 1 kw at a pressure of 0.1 Torr in the chamber was conducted to obtain a phosphorus-doped n-type a—Si layer 24 of a thickness of 700 Å.

Subsequently the foregoing step was repeated without the introduction of $PH_3$ gas to obtain an i-type a—Si layer 25 of a thickness of 5000 Å.

Then the foregoing step was repeated except that 40 sccm of diborane gas $B_2H_6$, diluted to 1000 ppm with hydrogen gas, was introduced, to obtain a boron-doped p-type a—Si layer 26 of a thickness of 700 Å. Then electrodes 27 of a thickness of 1000 Å were formed by vacuum evaporation on the p-type layer to obtain a PIN diode.

The diode element of an area of 1 cm² thus obtained was subjected to the measurement of I–V characteristic for evaluating the rectifying characteristic and the photovoltaic effect. The obtained results are summarized in Table 3.

When illuminated with light of an intensity AMI (about 100 mW/cm²) through the substrate, the diode showed a conversion efficiency of 8.5% or higher, an open circuit voltage of 0.92 V, and a short circuit current of 10.5 mA/cm².

EXAMPLES 7–9

PIN diodes were prepared by repeating the process of the Example 6 except that linear $Si_4H_{10}$, branched $Si_4H_{10}$ or $H_6Si_6F_6$ was employed as the silicon compound instead of $Si_3H_6$.

The obtained rectifying characteristic and photovoltaic effect are summarized in Table 3.

The results in Table 3 indicate that the method of the present invention allows the obtainment of an a—Si deposition film of satisfactory optical and electrical properties at a lower substrate temperature than that in the conventional technology.

EXAMPLE 10

Figure 5:
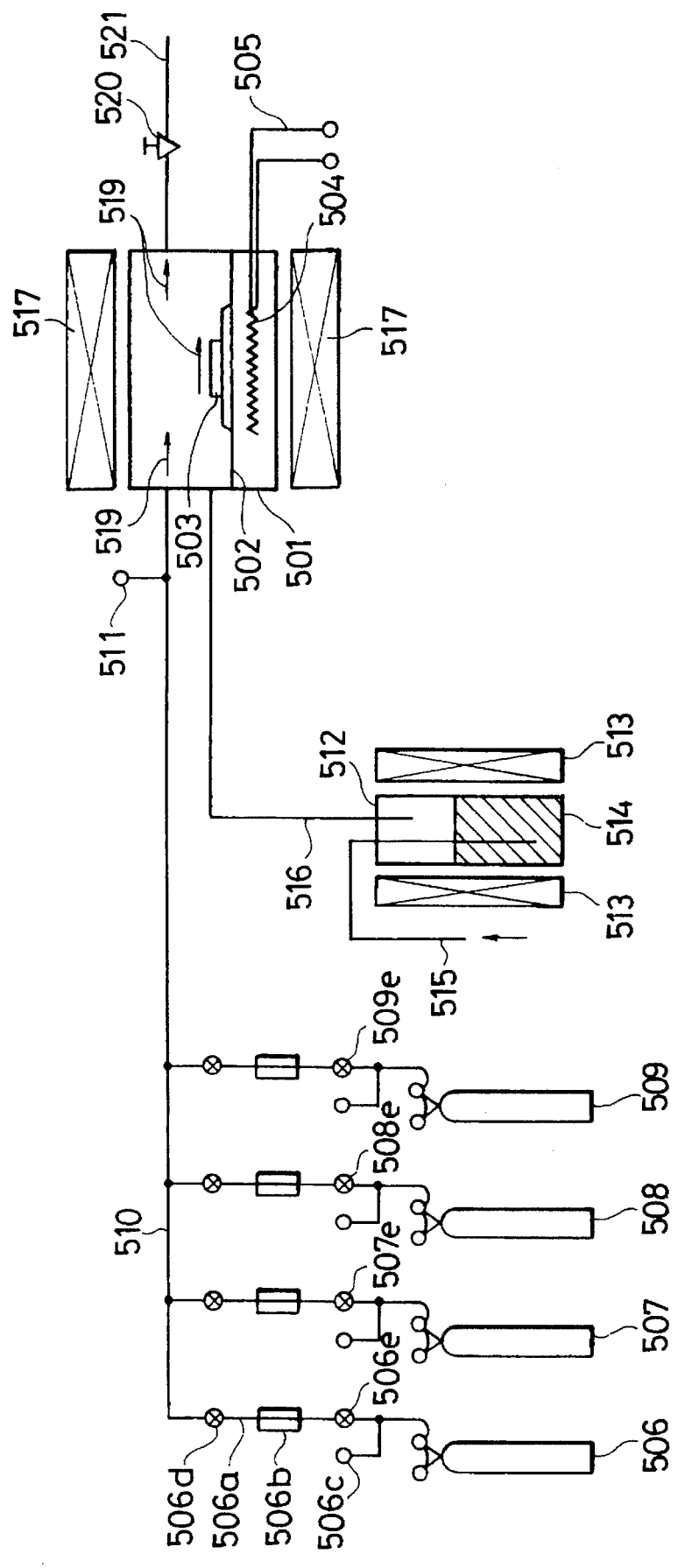

An apparatus shown in FIG. 5 was employed for preparing a—Si deposition films of i-, p- and n-type through the following operations.

Referring to FIG. 5, a film forming chamber 501 is provided therein with a substrate support 502 on which a desired substrate 503 is placed.

A heater 504 for heating the substrate is powered through lead wires 505. The temperature of the substrate is not critical, but, in the execution of the method of the present invention, the substrate is preferably heated to a temperature in a range of 50°–150° C., more preferably 100°–150° C.

Gas sources 506–509 are provided for the silicon compound, and optionally for other gases such as hydrogen, halogen gas, inert gas, impurity-containing compound etc. A suitable gasifier is provided for any liquidous material to be employed. In the gas sources 506–509, suffixes a indicate branch tubes, b flow meters, c pressure gauges for measuring the pressure at the high-pressure side of the flow meters, d and e valves for adjusting flow rates. There are further provided a gas introducing tube 510 for the film forming chamber; a gas pressure gauge 511; an activating chamber 512; an electric furnace 513; solid germanium particles 514; an introducing tube 515 for the gaseous compound containing germanium and halogen for generating the active species; and an introducing tube 516 for the active species, generated in the activating chamber 512, into the film forming chamber 501.

A thermal energy generator 517 can be composed of an ordinary electric furnace, a high frequency heater or other various heating members.

Heat generated by the thermal energy generator 517 is applied to the raw material gases flowing in a direction 519, thus exciting the gases and causing reaction therein to form an a—Si deposition film on the substrate 503 or a part thereof. In FIG. 5 there are also shown an exhaust valve 520 and an exhaust tube 521.

At first a substrate 503 composed of a polyethylene terephthalate film was placed on the support 502, and the film forming chamber 501 was evacuated to $10^{-6}$ Torr with a vacuum system. The substrate was maintained at a temperature shown in Table 4, and 150 sccm of $Si_5H_{10}$ from the gas source 506, optionally mixed with 40 sccm of $PH_3$ or $B_2H_6$, diluted to 1000 ppm with hydrogen gas, was introduced into the chamber.

The activating chamber 502 was charged with solid germanium particles 514, which were fused by heating with the electric furnace 513, and $GeF_4$ was blown therein from a bomb container through the tube 515, thus generating an active species $GeF_2^*$ for supply into the film forming chamber 501 through the introducing tube 516.

The film forming chamber 501 was maintained at a pressure of 0.1 Torr and at a temperature of 250° C. by the thermal energy generator 517 to obtain an undoped or doped a—Si film of a thickness of 700 Å, with a film forming rate of 23 Å/sec.

The undoped or p-type a—Si film thus formed was then placed in an evaporation tank for forming comb-shaped aluminum electrodes (length 250μ, width 5 mm) at a pressure of $10^{-5}$ Torr. The obtained sample of a—Si film was evaluated by the dark conductivity $\sigma_d$ calculated from the dark current at an applied voltage of 10 V. The results are shown in Table 4.

EXAMPLES 11–13

The process of Example 10 was repeated except that $Si_5H_{10}$ was replaced by linear $Si_4H_{10}$, branched $Si_4H_{10}$ or $H_6Si_6F_6$. The obtained values of dark conductivity are summarized in Table 4.

The results in Table 4 indicate that the method of the present invention allows the obtainment of an a—Si film having excellent electric characteristics, that is, a satisfactorily high value of G even at a low substrate temperature, and a sufficient doping therein.

EXAMPLE 14

Figure 6:
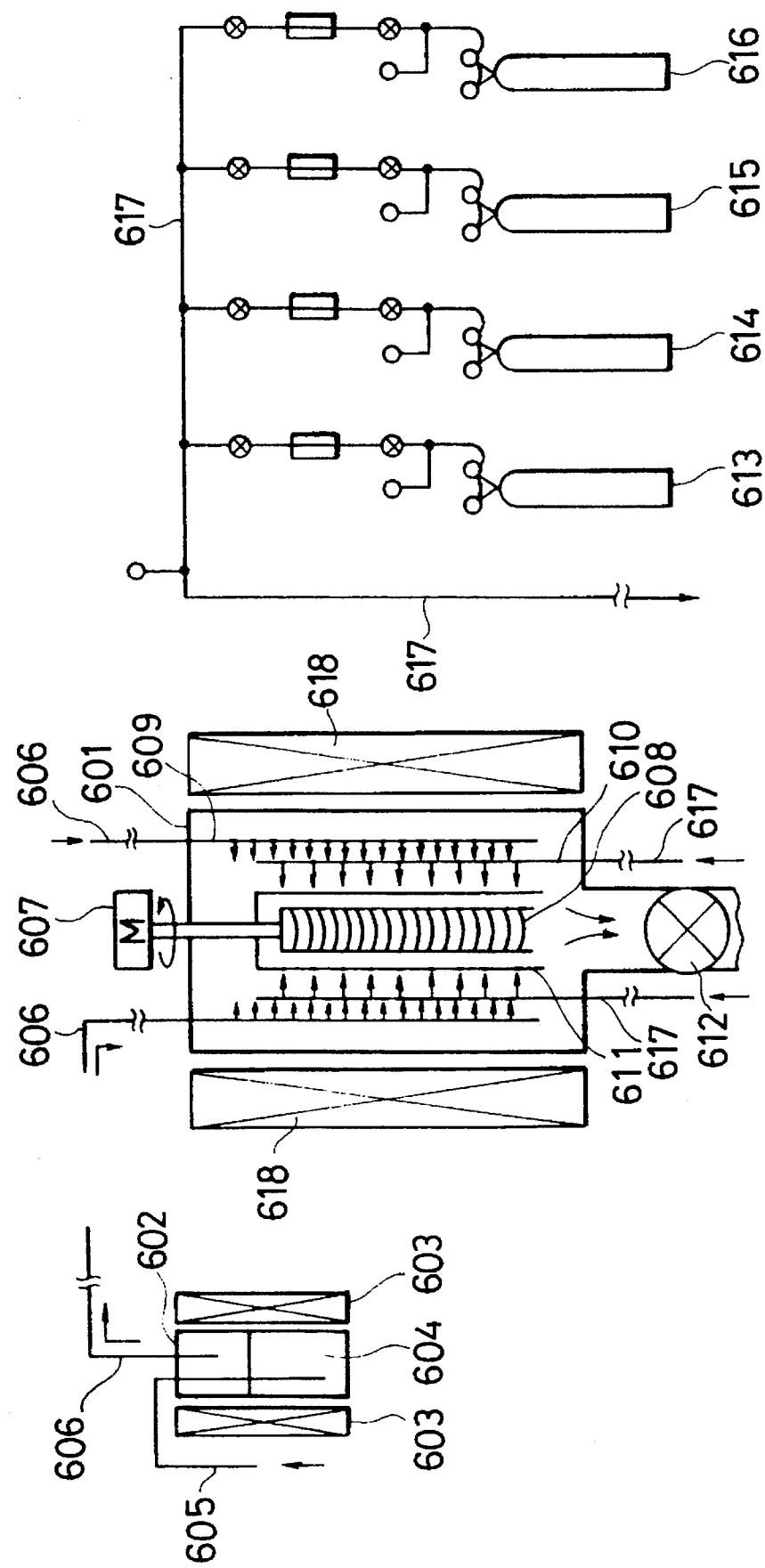

An apparatus shown in FIG. 6 was employed for preparing a drum-shaped electrophotographic imaging member of a structure as shown in FIG. 1, through the following operations.

Referring to FIG. 6, there are provided a film forming chamber 601, an activating chamber 602, an electric furnace 603, solid germanium particles 604, a tube for introducing active species-forming substance 605, an active species introducing tube 606, a motor 607, a heater 60 8, blowing tubes 609 and 6 10, an aluminum cylinder 6 11, an exhaust valve 6 12, gas sources 613–616 similar to those 506–509 shown in FIG. 5, and a gas introducing tube 617.

The aluminum cylinder 611 suspended in the film forming chamber 601 was rendered rotatable by the motor 607 and was internally heated by the heater 608. A thermal energy generator 618 can be composed for example of an ordinary electric furnace, a high frequency heater or other heating elements.

The activating chamber 602 was charged with solid germanium particles 604, which were melted by heating with the electric furnace 603, and $GeF_4$ was blown therein from a bomb container to generate an active species $GeF_2^*$ for supply into the film forming chamber 601 through the tube 606.

Separately $Si_2H_6$ and $H_2$ were introduced through the tube 617 into the chamber 601, which was maintained at a pressure of 1.0 Torr, and the interior of the chamber 601 was maintained at 250° C. by the thermal energy generator.

During the process, the aluminum cylinder 611 was heated to 280° C. by the heater and rotated, and the used gas was discharged through the exhaust valve 612. A photosensitive layer 13 was formed in this manner.

An intermediate layer of a thickness of 2000 Å was also formed by introducing a gaseous mixture of $H_2$ and $B_2H_6$, containing $B_2H_6$ in 0.2 vol. %, through the tube 617.

Reference Example 2

An amorphous silicon deposition film was formed in an ordinary plasma CVD process, utilizing $SiF_4$, $Si_2H_6$, $H_2$ and $B_2H_6$ in the film forming chamber shown in FIG. 6, additionally equipped with a high frequency generator of 13.56 MHz.

Table 5 summarizes the manufacturing conditions and performances of the drum-shaped electrophotographic imaging members obtained in Example 14 and Reference Example 2.

EXAMPLE 15

A PIN diode as shown in FIG. 2 was prepared in the apparatus shown in FIG. 5, utilizing $Si_3H_6$ as the silicon compound.

A polyethylene naphthalate substrate 21 having an evaporated ITO film 22 of a thickness of 1000 Å was placed on the support, and the chamber was evacuated to $10^{-6}$ Torr. Then an active species $GeF_2^*$ was introduced from the tube 516 as in Example 10, 150 sccm of $Si_3H_6$ and $PH_3$ diluted to 1000 ppm with hydrogen gas from the tube 510, and 20 sccm of a halogen gas from another tube, and the chamber was maintained at 0.1 Torr and 250° C. to obtain an n-type phosphorus-doped a—Si layer 24 of a thickness of 700 Å.

Subsequently the foregoing step was repeated without the introduction of $PH_3$ gas to obtain an i-type a—Si layer 25 of a thickness of 5000 Å.

Then the foregoing step was repeated except that 40 sccm of diborane gas $B_2H_6$, diluted to 1000 ppm with hydrogen gas, was introduced, to obtain a boron-doped p-type a—Si layer 26 of a thickness of 700 Å. Then aluminum electrodes 27 of a thickness of 1000 Å were formed by vacuum evaporation on the p-type layer to obtain a PIN diode.

The diode element of an area of 1 cm² thus obtained was measured for I–V characteristic to evaluate the rectifying characteristic and photovoltaic effect. The obtained results are summarized in Table 6.

When illuminated with light of an intensity AMI (about 100 mW/cm²) through the substrate, the diode showed a conversion efficiency of 8.5% or higher, an open circuit voltage of 0.92 V, and a short circuit current of 10.5 mA/cm².

EXAMPLE 16–18

PIN diodes were prepared by reproducing the process of Example 15 except that linear $Si_4H_{10}$, branched $Si_4H_{10}$ or $H_6Si_6F_6$ was employed as the silicon compound instead of $Si_3H_6$. The obtained rectifying characteristic and photovoltaic effect are summerized in Table 6.

The results in Table 6 indicate that the method of the present invention allows the obtainment of an a—Si deposition film of satisfactory optical and electrical properties at a lower substrate temperature than in the conventional technology.

EXAMPLE 19

Figure 7:
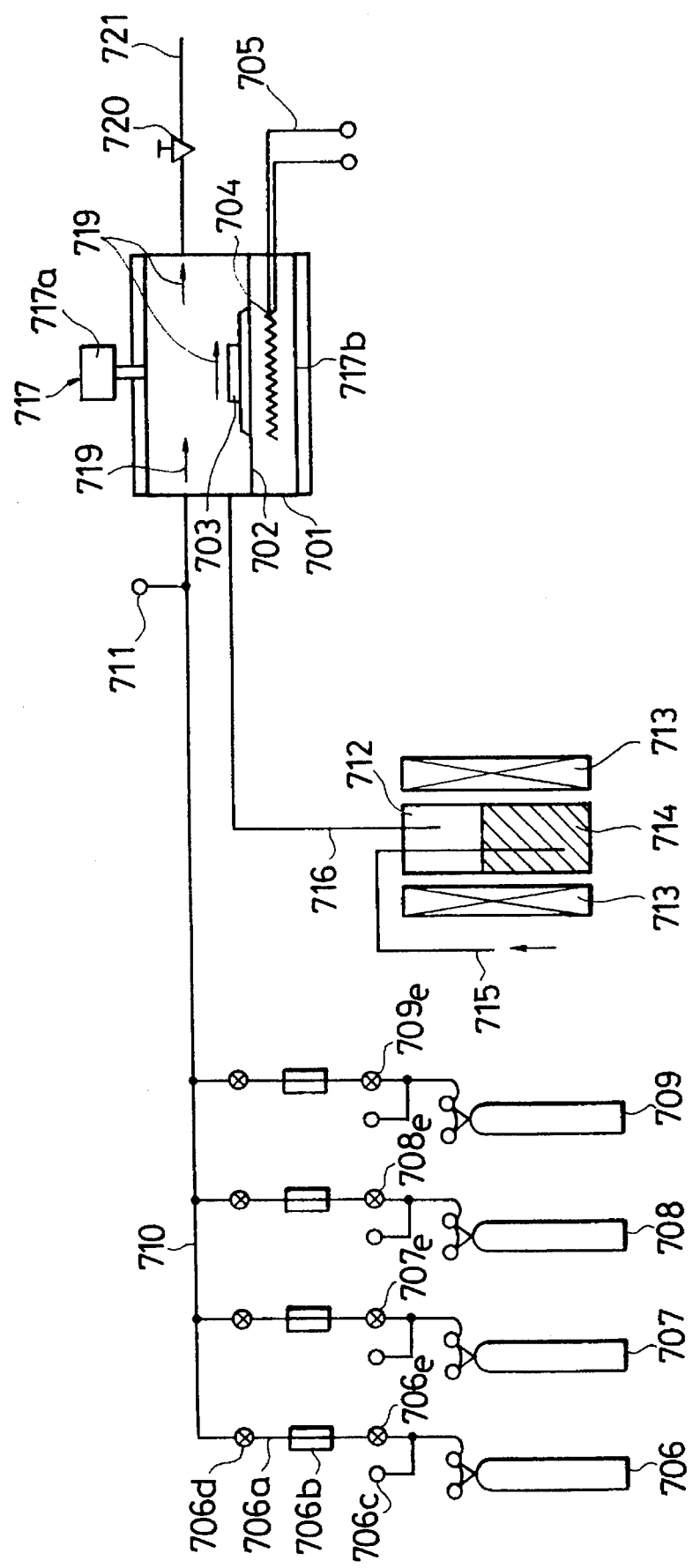

An apparatus shown in FIG. 7 was employed for preparing a—Si deposition films of i-, p- and n-type through the following operations.

Referring to FIG. 7, a film forming chamber 701 is provided therein with a substrate support 702 on which a desired substrate 703 is placed.

A heater 704 for heating the substrate is powered through lead wires 705, but is not activated during the film formation. The heating temperature of the substrate is not critical, but, in the case where the substrate is to be heated prior to the film formation in the execution of the method of the present invention, the substrate is heated to a temperature preferably in a range of 50°–150° C., more preferably 100°–150° C.

Gas sources 706–709 are provided for the silicon compound, and optionally for other gases such as hydrogen, halogen gas, inert gas, impurity-containing compound etc. A suitable gasifier is provided for any liquidous material to be employed. In the gas sources 706–709, suffixes a indicate branch tubes, b flow meters, c pressure gauges for measuring the pressure at the high-pressure side of the flow meters, d and e valves for adjusting flow rates. There are further provided a gas introducing tube 710 into the film forming chamber; a gas pressure gauge 711; an activating chamber 712; an electric furnace 713; solid germanium particles 714; an introducing tube 715 for the gaseous compound containing germanium and halogen for generating the active species; and an introducing tube 716 for the active species, generated in the activating chamber 712, into the film forming chamber 701.

A discharge energy generator 717 is provided for example with a matching box 717a and a high frequency cathode electrode 717b.

Discharge energy generated by the discharge energy generator 717 is applied to the raw material gases flowing in a direction 719, thus exciting said gases and causing reaction therein to form an .a—Si deposition film on the substrate 703 or a part thereof. In FIG. 7 there are also shown an exhaust valve 720 and an exhaust tube 721.

At first a substrate 703 composed of a polyethylene terephthalate film was placed on the support 702, and the film forming chamber 701 was evacuated to $10^{-6}$ Torr with a vacuum system. The substrate was maintained at a temperature shown in Table 7, and 150 sccm of $Si_5H_{10}$ from the gas source 706, optionally mixed with 40 sccm of $PH_3$ or $B_2H_6$, diluted to 1000 ppm with hydrogen gas, was introduced into the chamber.

The activating chamber 702 was charged with solid germanium particles 714, which were fused by heating with the electric furnace 713, and $GeF_4$ was blown therein from a bomb container through the tube 715, thus generating an active species $GeF_2^*$ for supply into the film forming chamber 701 through the introducing tube 716.

Plasma was applied from the discharge energy generator while the film forming chamber was maintained at a pressure of 0.1 Torr, thus forming an undoped or doped a—Si film of a thickness of 700 Å, with a film forming rate of 27 Å/sec.

The undoped or p-type a—Si film thus formed was then placed in an evaporation tank for forming comb-shaped aluminum electrodes (length 250µ, width 5 mm) at a pressure of $10^{-5}$ torr. The obtained sample of a—Si film was evaluated by the dark conductivity $\sigma_d$ calculated from the dark current at an applied voltage of 10 V. The results are summarized in Table 7.

EXAMPLES 20–22

The process of Example 19 was repeated except that $Si_5H_{10}$ was replaced by linear $Si_4H_{10}$, branched $Si_4H_{10}$ or $H_6Si_6F_6$. The obtained values of dark conductivity are summarized in Table 7.

The results in Table 7 indicate that the method of the present invention allows the obtainment of an a—Si film having excellent electrical properties, that is, a satisfactorily high value of σ even at a low substrate temperature, and a sufficient doping therein.

EXAMPLE 23

Figure 8:
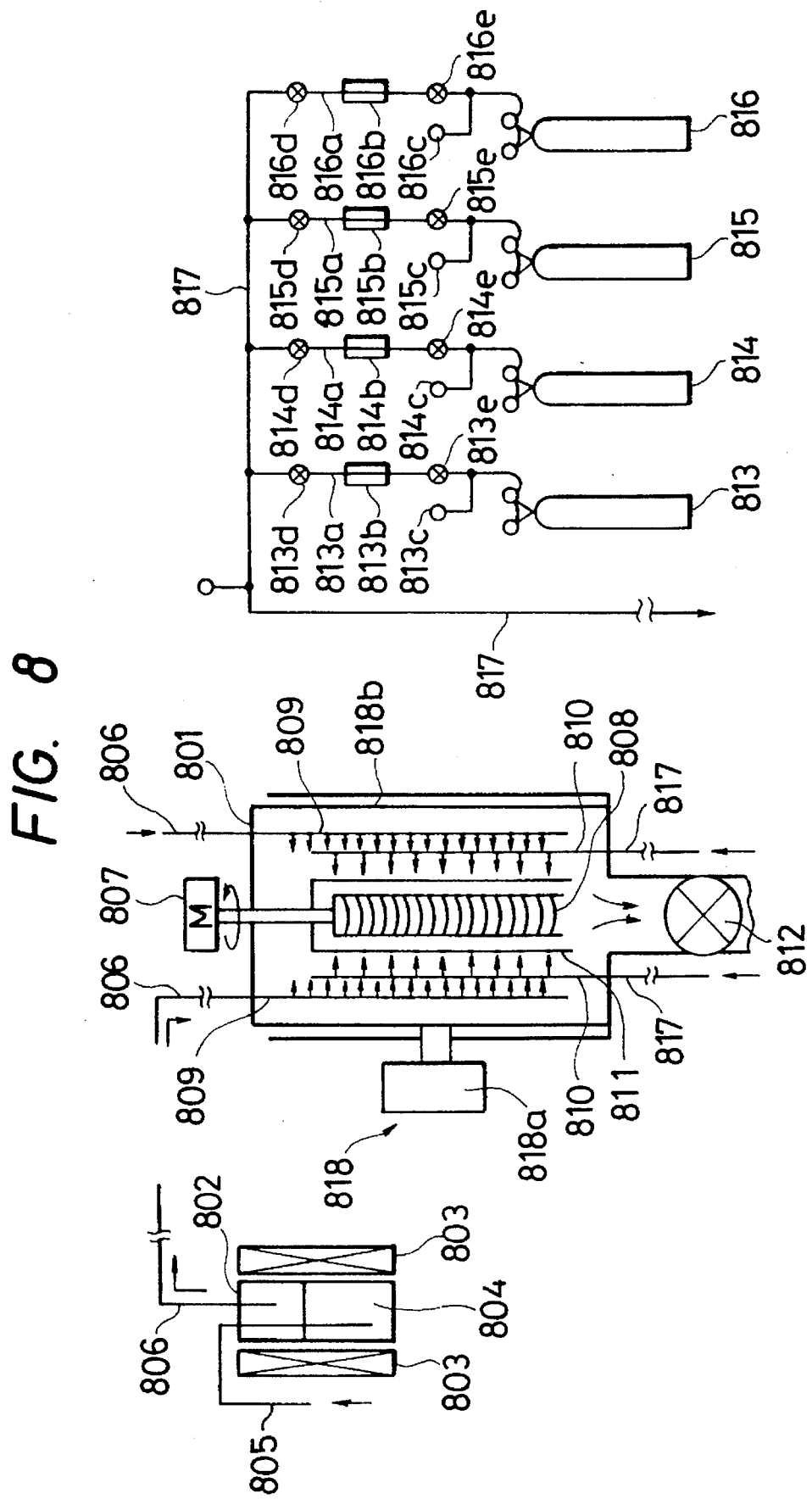

An apparatus shown in FIG. 8 was employed for preparing a drum-shaped electrophotographic imaging member of a structure as shown in FIG. 1, through the following operations.

Referring to FIG. 8, there are provided a film forming chamber 801, an activating chamber 802, an electric furnace 803, solid germanium particles 804, a tube introducing the material for an active species 805, an active species introducing tube 806, a motor 807, a heater 808, blowing tubes 809 and 810, an aluminum cylinder 811, an exhaust valve 812, gas sources 813–816 similar to those 706–709 shown in FIG. 7, and a gas introducing tube 817.

The aluminum cylinder 811 suspended in the film forming chamber 801 was rendered rotatable by the motor 807 and was internally heated by the heater 808. Each discharge energy generator 818 is provided with a matching box 818a, a high frequency cathode 818b etc.

The activating chamber 802 was charged with solid germanium particles 804, which were melted by heating with the electric furnace 803, and $GeF_4$ was blown therein from a bomb container to generate an active species $GeF_2^*$ for supply into the film forming chamber 801 through the tube 806.

Separately $Si_2H_6$ and $H_2$ were introduced through the tube 817 into the chamber 801, and plasma from the discharge energy generator 818 was applied to the chamber 801 maintained at a pressure of 1.0 Torr.

During the process, the aluminum cylinder 811 was heated to 280° C. by the heater and rotated, and the used gas was discharged through the exhaust valve 812. A photosensitive layer 13 was formed in this manner.

An intermediate layer of a thickness of 2000 Å was also formed by introducing a gaseous mixture of $H_2$ and $B_2H_6$, containing $B_2H_6$ in 0.2 vol. %, through the tube 817.

Reference Example 3

An amorphous silicon deposition film was formed in an ordinary plasma CVD process, utilizing $SiF_4$, $Si_2H_6$, $H_2$ and $B_2H_6$ in the film forming chamber 801 shown in FIG. 8, additionally equipped with a high frequency generator of 13.56 MHz.

Table 8 summarizes the manufacturing conditions and performances of the drum-shaped electrophotographic imaging members obtained in Example 23 and Reference Example 3.

EXAMPLE 24

A PIN diode as shown in FIG. 2 was prepared in the apparatus shown in FIG. 7, utilizing $Si_3H_6$ as the silicon compound.

A polyethylene naphthalate film 21 having an evaporated ITO film 22 of a thickness of 1000 Å was placed on the support, and the chamber was evacuated to $10^{-6}$ Torr. Then an active species $GeF_2^*$ was introduced from the tube 716 as in Example 15, also 150 sccm of $Si_3H_6$ and $PH_3$ diluted to 1000 ppm with hydrogen gas from the tube 710, and 20 sccm of a halogen gas from another tube. The chamber was maintained at a pressure of 0.1 Torr and plasma was applied by the discharge energy generator. In this manner there was obtained an n-type phosphorus-doped a—Si layer 24 of a thickness of 700 Å.

Subsequently the foregoing step was repeated without the introduction of $PH_3$ to obtain an i-type a—Si layer 25 of a thickness of 5000 Å.

Then the foregoing step was repeated except that 40 sccm of diborane gas $B_2H_6$, diluted to 1000 ppm with hydrogen gas, was introduced, to obtain a boron-doped p-type a—Si layer 26 of a thickness of 700 Å. Then aluminum electrodes 27 of a thickness of 1000 Å were formed by vacuum evaporation on the p-type film to complete a PIN diode.

The diode element of an area of 1 cm$^2$ thus obtained was measured for I–V characteristic to evaluate the rectifying characteristic and photovoltaic effect. The obtained results are summarized in Table 9.

When illuminated with light of an intensity AMI (about 100 mW/cm$^2$) through the substrate, the diode showed a conversion efficiency of 8.5% or higher, an open circuit voltage of 0.92 V, and a short circuit current of 10.5 mA/cm$^2$.

EXAMPLE 25–27

PIN diodes were prepared by repeating the process of Example 24 except that linear $Si_4H_{10}$, branched $Si_4H_{10}$ or $H_6Si_6H_6$ was employed as the silicon compound instead of $Si_3H_6$. The obtained rectifying characteristic and photovoltaic effect are summarized in Table 9.

The results in Table 9 indicate that the method of the present invention allows the obtainment of an a—Si deposition film of satisfactory optical and electrical characteristics at a lower substrate temperature than in the conventional technology.

TABLE 1

|  | Example 1 | Example 2 | Example 3 | Example 4 |
|---|---|---|---|---|
| Silicon compound | $Si_5H_{10}$ | $Si_4H_{10}$ | $SiH_3SiH$—$(SiH_3)SiH_3$ | $H_6Si_6F_6$ |
| Substrate temperature (°C.) | 50 | 60 | 80 | 75 |
| $\sigma_d$ (undoped) $(\Omega \cdot cm)^{-1}$ | $6.6 \times 10^{-8}$ | $4.5 \times 10^{-7}$ | $5.6 \times 10^{-8}$ | $4.2 \times 10^{-8}$ |
| $\sigma_d$ (p-type) | $4.3 \times 10^{-7}$ | $6.8 \times 10^{-7}$ | $4.1 \times 10^{-7}$ | $4.8 \times 10^{-7}$ |

TABLE 2

|  | Example 5 | Reference Example 1 |
|---|---|---|
| Activating chamber | $GeF_4$ | — |
| Activating temperature | 1100° C. | — |
| Primary active species generated | $GeF_2^*$ | — |
| Tube 217 | $Si_2H_6/H_2$ | — |
| Amount from activating chamber | 200 sccm | — |
| Amount from tube 217 | 100 sccm | — |
| Amounts from bombs | — | $GeF_4$ 200 sccm $Si_2H_6$ 100 sccm $H_2$ 100 sccm |
| Pressure in film forming chamber | 1.0 Torr | 1.0 Torr |
| Substrate temperature | — | 260° C. |
| Film forming speed | 10 Å/sec | 5 Å/sec |
| Plasma RF | — | 130 W |
| Thickness of photosensitve layer 13 | 22μ | 17μ |
| Average number of defects in 10 electrophotographic imaging drums | 2 | 15 |
| Acceptance potential fluctuation in circumferential direction | ±10 V | ±30 V |
| Generatrix direction | ±15 V | ±35 V |
| Note | Method of present invention | Conventional plasma CVD process |

TABLE 3

|  | Example 6 | Example 7 | Example 8 | Example 9 |
|---|---|---|---|---|
| Gaseous material for film formation | $Si_3H_6$ | $Si_4H_{10}$ | $SiH_3SiH$—$(SiH_3)SiH_3$ | $H_6Si_6F_6$ |
| Substrate temperature (°C.) | 80 | 80 | 80 | 80 |
| Rectification ratio of diode (*1) | $8.5 \times 10^2$ | $8 \times 10^2$ | $6.5 \times 10^2$ | $6.5 \times 10^2$ |
| n value of diode (*2) | 1.3 | 1.5 | 1.4 | 1.4 |

*1: Ratio of current in normal direction to current in opposite direction at a voltage of 1 V.
*2: Value n (quantity factor) in pn junction current equation $$J = J_s \left\{ \exp\left( \frac{eV}{nRT} \right) - 1 \right\}$$

TABLE 4

|  | Example 10 | Example 11 | Example 12 | Example 13 |
|---|---|---|---|---|
| Silicon compound | $Si_5H_{10}$ | $Si_4H_{10}$ | $SiH_3SiH$—$(SiH_3)SiH_3$ | $H_6Si_6F_6$ |
| Substrate temperature (°C.) | 280 | 280 | 280 | 280 |
| $\sigma_d$ (undoped) $(\Omega \cdot cm)^{-1}$ | $7.9 \times 10^{-8}$ | $5.8 \times 10^{-8}$ | $5.3 \times 10^{-8}$ | $4.1 \times 10^{-8}$ |
| $\sigma_d$ (p-type) $(\Omega \cdot cm)^{-1}$ | $6.4 \times 10^{-7}$ | $2.8 \times 10^{-7}$ | $3.8 \times 10^{-7}$ | $4 \times 10^{-7}$ |

TABLE 5

|  | Example 14 | Reference Example 2 |
|---|---|---|
| Activating chamber | $GeF_4$ | — |
| Activating temperature | 1100° C. | — |
| Primary active species generated | $GeF_2$* | — |
| Tube 217 | $Si_2H_6/H_2$ | — |
| Amount from activating chamber | 200 sccm | — |
| Amount from tube 217 | 100 sccm | — |
| Amounts from bombs | — | $GeF_4$ 200 sccm<br>$Si_2H_6$ 100 sccm<br>$H_2$ 100 sccm |
| Pressure in film forming chamber | 1.0 Torr | 1.0 Torr |
| Substrate temperature | 280° C. | 260° C. |
| Temperature in film forming chamber | 250° C. | |
| Film forming speed | 20 Å/sec | 5 Å/sec |
| Plasma RF | — | 130 W |
| Thickness of photo-sensitive layer 13 | 22μ | 17μ |
| Average number of defects in 10 electrophotographic imaging drums | 2 | 15 |
| Acceptance potential fluctuation in circumferential direction | ±10 V | ±30 V |
| Generatrix direction | ±15 V | ±35 V |
| Note | Method of present invention | Conventional plasma CVD process |

TABLE 6

|  | Example 15 | Example 16 | Example 17 | Example 18 |
|---|---|---|---|---|
| Gaseous material for film formation | $Si_3H_6$ | $Si_4H_{10}$ | $SiH_3SiH—(SiH_3)SiH_3$ | $H_6Si_6F_6$ |
| Substrate temperature (°C.) | 280 | 280 | 280 | 280 |
| Rectification ratio of diode (*1) | $6 \times 10^2$ | $7 \times 10^2$ | $7 \times 10^2$ | $6.5 \times 10^2$ |
| n value of diode (*2) | 1.4 | 1.3 | 1.5 | 1.4 |

*1: Ratio of current in normal direction to current in opposite direction at a voltage of 1 V.
*2: Value n (quality factor) in a pn junction current equation $$J = J_s \left( \exp\left( \frac{eV}{nRT} \right) - 1 \right).$$

TABLE 7

|  | Example 19 | Example 20 | Example 21 | Example 22 |
|---|---|---|---|---|
| Silicon compound | $Si_5H_{10}$ | $Si_4H_{10}$ | $SiH_3SiH—(SiH_3)SiH_3$ | $H_6Si_6F_6$ |
| Substrate temperature (°C.) | 280 | 280 | 280 | 280 |
| $\sigma_d$ (undoped) $(\Omega \cdot cm)^{-1}$ | $7.3 \times 10^{-8}$ | $4.5 \times 10^{-7}$ | $4.8 \times 10^{-8}$ | $3 \times 10^{-8}$ |
| $\sigma_d$ (p-type) | $7.1 \times 10^{-7}$ | $3.1 \times 10^{-7}$ | $4.1 \times 10^{-7}$ | $4.2 \times 10^{-7}$ |

TABLE 8

|  | Example 23 | Reference example 3 |
|---|---|---|
| Activating chamber | $GeF_4$ | — |
| Activating temperature | 1100° C. | — |
| Primary active species generated | $GeF_2$* | — |
| Tube 217 | $Si_2H_6/H_2$ | — |
| Amount from activating chamber | 200 sccm | — |
| Amount from tube 217 | 100 sccm | — |
| Amounts from bombs | — | $GeF_4$ 200 sccm<br>$Si_2H_6$ 100 sccm<br>$H_2$ 100 sccm |
| Pressure in film forming chamber | 1.0 Torr | 1.0 Torr |
| Substrate temperature | 280° C. | 260° C. |
| Temperature in film forming chamber | 250° C. | |
| Film forming speed | 24 Å/sec | 5 Å/sec |
| Plasma RF | 80 W | 130 W |
| Thickness of photo-sensitive layer 13 | 22μ | 17μ |
| Average number of defects in 10 electro-photographic imaging drums | 2 | 15 |
| Acceptance potential fluctuation in circumferential direction | ±10 V | ±30 V |
| generatrix direction | ±15 V | ±35 V |
| Note | Method of present invention | Conventional CVD process |

TABLE 9

|  | Example 24 | Example 25 | Example 26 | Example 27 |
|---|---|---|---|---|
| Gaseous material for film formation | $Si_3H_6$ | $Si_4H_{10}$ | $SiH_3SiH—(SiH_3)SiH_3$ | $H_6Si_6F_6$ |
| Rectification ratio of diode (*1) | $7.5 \times 10^2$ | $8 \times 10^2$ | $6 \times 10^2$ | $8.5 \times 10^2$ |
| n value of diode (*2) | 1.3 | 1.5 | 1.3 | 1.4 |

*1: Ratio of current in normal direction to current in opposite direction at a voltage of 1 V.
*2: Value n (quality factor) in a pn junction current equation $$J = J_s \left\{ \exp\left( \frac{eV}{nRT} \right) - 1 \right\}$$

What we claimed is:

1. A method for forming a deposition film, comprising:

decomposing a first compound containing germanium and halogen in an activation chamber by applying an energy to form an active species, wherein the lifetime of such active species is 0.1 seconds or longer;

separately introducing, into a film-forming chamber for forming a deposition film on a substrate, a second compound containing silicon and hydrogen and said active species, said active species being capable of chemical interaction with said second compound containing silicon and hydrogen; and applying to a mixture of said second compound and said active species at least one excitation energy selected from the group consisting of optical, thermal and electrical discharge energies to excite said second compound in said mixture thereby facilitating the formation of a deposition film on said substrate.

2. A method according to claim 1, wherein said second compound is a chain silane compound.

3. A method according to claim 1, wherein said second compound is a cyclic silane compound.

4. A method according to claims 1, wherein said compound containing germanium and halogen is a cyclic germanium halide.

5. A method according to claim 1, further comprising introducing an active species generated from a compound containing silicon and halogen.

6. A method according to claim 1, wherein the generation of said active species is conducted by means of at least one excitation energy selected from the group consisting of electrical discharge, thermal and optical energies.

7. A method according to claim 1, wherein the ratio of said second compound and said active species introduced into said chamber is in a range from 10:1 to 1:10.

8. A method for forming a deposition film on a substrate, comprising:

separately introducing, into a film-forming chamber for forming a deposition film on a substrate, a non-activated silicon compound as a starting material for forming a deposition film and an active species formed by adding a compound comprising germanium and halogen to heated solid germanium particles to decompose the compound comprising germanium and halogen and being capable of chemical interaction with the silicon compound; and applying thereto at least one excitation energy selected from the group consisting of optical, thermal and electrical discharge energies to excite the silicon compound, thereby effecting a chemical reaction to form a deposition film on the substrate.

9. A method according to claim 8, wherein said non-activated silicon compound is a chain silane compound.

10. A method according to claim 8, wherein said non-activated silicon compound is a cyclic silane compound.

11. A method according to claim 8, wherein the ratio of said non-activated silicon compound and said active species introduced into said chamber is in a range from 10:1 to 1:10.

12. A method according to claims 1 or 8, wherein said compound containing germanium and halogen is a chain germanium halide.

13. A method according to claims 1 or 8, further comprising introducing an active species generated from a compound containing carbon and halogen.

14. A method according to claims 1 or 8, further comprising introducing a compound containing an impurity element.

15. A method according to claim 14, wherein the impurity element belongs to the group IIIA of the periodic table.

16. A method according to claim 14, wherein the impurity element belongs to the group VA of the periodic table.

* * * * *

UNITED STATES PATENT AND TRADEMARK OFFICE
CERTIFICATE OF CORRECTION

PATENT NO. : 5,476,694

DATED : December 19, 1995

INVENTORS : SHUNICHI ISHIHARA, ET AL.

It is certified that error appears in the above-identified patent and that said Letters Patent is hereby corrected as shown below:

ON TITLE PAGE

In [63] Related U.S. Application Data "Mar. 14, 1992," should read --March 14, 1991,--.

COLUMN 1

Line 54, "to" should read --on--.

COLUMN 2

Line 32, "Optical," should read --optical,--.
Line 42, "invent ion;" should read --invention;--.

COLUMN 3

Line 10, "enerzy," should read --energy,--.
Line 29, "deposition" should read --decomposition--.
Line 63, "$Si_2H_5SiH(SiH_3)Si_2H_5)$;" should read --$Si_2H_5SiH(SiH_3)Si_2H_5$;--.

UNITED STATES PATENT AND TRADEMARK OFFICE
CERTIFICATE OF CORRECTION

PATENT NO. : 5,476,694

DATED : December 19, 1995

INVENTORS : SHUNICHI ISHIHARA, ET AL.

It is certified that error appears in the above-identified patent and that said Letters Patent is hereby corrected as shown below:

COLUMN 4

Line 25, "y" should read --Y--.
Line 38, "containing." --containing--.
Line 53, "(SICl$_2$)$_5$," should read --(SiCl$_2$)$_5$,--.
Line 66, "u and y" should read --u and Y--.

COLUMN 5

Line 60, "following" should read --following,--.

COLUMN 6

Line 33, "!" should be deleted.
Line 67, "50Åto" should read --50Å to--.

COLUMN 7

Line 40, "Pd" should read --Pd,--.
Line 65, "following" should read --following,--.

UNITED STATES PATENT AND TRADEMARK OFFICE
CERTIFICATE OF CORRECTION

PATENT NO. : 5,476,694

DATED : December 19, 1995

INVENTORS : SHUNICHI ISHIHARA, ET AL.

It is certified that error appears in the above-identified patent and that said Letters Patent is hereby corrected as shown below:

COLUMN 8

Line 3, "a-Side position" should read --a-Si deposition--.
Line 20, ".any" should read --any--.
Line 22, "suffices" should read --suffixes--.
Line 53, "$Ge_4$" should read --$GeF_4$--.
Line 54, "tube 115" should read --tube 115,--.
Line 57, "j0.1" should read --0.1--.
Line 62, "comb-shaped." should read --comb-shaped--.

COLUMN 11

Line 51, "G" should read --$\sigma$--.
Line 64, "heater 60 8," should read --heater 608,--.
Line 65, "6 10," should read --610,-- and "6 11," should read --611,--.
Line 66, "6 12," should read --612,--.

UNITED STATES PATENT AND TRADEMARK OFFICE
CERTIFICATE OF CORRECTION

PATENT NO. : 5,476,694

DATED : December 19, 1995

INVENTORS : SHUNICHI ISHIHARA, ET AL.

It is certified that error appears in the above-identified patent and that said Letters Patent is hereby corrected as shown below:

COLUMN 13

Line 50, ".a-Si" should read --a-Si--.

COLUMN 15

Table 1, "$4.5 \times 10^{-7}$" should read $4.5 \times 10^{-8}$--.

COLUMN 17

Table 7, "$4.5 \times 10^{-7}$" should read $4.5 \times 10^{-8}$--.

UNITED STATES PATENT AND TRADEMARK OFFICE
CERTIFICATE OF CORRECTION

PATENT NO. : 5,476,694

DATED : December 19, 1995

INVENTORS : SHUNICHI ISHIHARA, ET AL.

It is certified that error appears in the above-identified patent and that said Letters Patent is hereby corrected as shown below:

<u>COLUMN 18</u>

Line 51, "claimed" should read --claim---.

<u>COLUMN 19</u>

Line 11, "claims 1," should read --claim 1,--.

Signed and Sealed this

Twenty-fifth Day of June, 1996

Attest:

BRUCE LEHMAN

Attesting Officer

Commissioner of Patents and Trademarks